United States Patent [19]

Gehring

[11] 4,442,411

[45] Apr. 10, 1984

[54] CIRCUIT FOR THE LOAD-PROPORTIONAL ADJUSTMENT OF THE DRIVING CURRENT OF A SINGLE-ENDED OUTPUT TRANSISTOR OF A TRANSISTOR AMPLIFIER, OPERATED IN A COMMON-EMITTER CIRCUIT

[75] Inventor: Gerhard Gehring, Unterhaching, Fed. Rep. of Germany

[73] Assignee: Siemens Aktiengesellschaft, Berlin and Munich, Fed. Rep. of Germany

[21] Appl. No.: 298,775

[22] Filed: Sep. 2, 1981

[30] Foreign Application Priority Data

Sep. 29, 1980 [DE] Fed. Rep. of Germany ....... 3036736

[51] Int. Cl.$^3$ .............................................. H03F 3/04
[52] U.S. Cl. .................................... 330/296; 330/288
[58] Field of Search ............... 330/288, 286, 296, 291; 323/315, 316

[56] References Cited

U.S. PATENT DOCUMENTS 3,701,032 10/1972 Steckler .............................. 330/291
4,074,181 2/1978 Crowle ................................ 330/291

Primary Examiner—James B. Mollins
Assistant Examiner—G. Wan
Attorney, Agent, or Firm—Herbert L. Lerner; Laurence A. Greenberg

[57] ABSTRACT

Circuit for the load-proportional adjustment of the driving current of a single-ended output transistor of a transistor amplifier for a variable load of the output transistor, the output transistor having a base-emitter voltage and being operated in a common emitter circuit, having a control branch feeding the driving current to the output transistor, including a sensing transistor stage having an output circuit and being driven by the base-emitter voltage of the output transistor, a transistor serving as a driver transistor for the output transistor and being controlled by the control branch, and a coupling circuit through which current in the output circuit of the sensing transistor is feedable to the transistor serving as a driver transistor.

5 Claims, 1 Drawing Figure

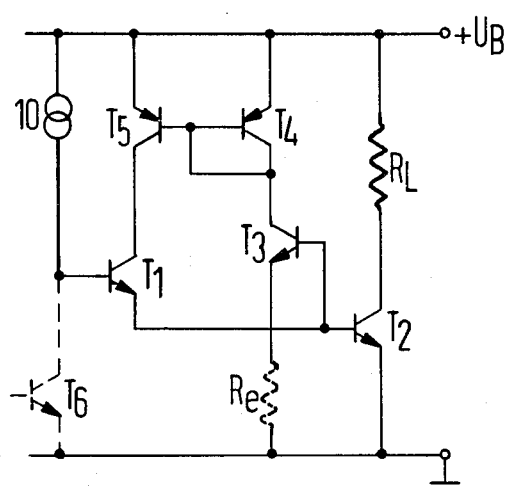

CIRCUIT FOR THE LOAD-PROPORTIONAL ADJUSTMENT OF THE DRIVING CURRENT OF A SINGLE-ENDED OUTPUT TRANSISTOR OF A TRANSISTOR AMPLIFIER, OPERATED IN A COMMON-EMITTER CIRCUIT

BACKGROUND OF THE INVENTION

The invention relates to a circuit for the load-proportional adjustment of the driving current of a single-ended output transistor of a transistor amplifier for a variable load of the output transistor, the output transistor being operated in a common-emitter circuit, and the driving current being fed to the output transistor through a control branch.

In single-ended output stages in a common-emitter circuit, it must be possible to make available the driving current corresponding to the maximally expected load current.

If very large load currents are expected, the driving current can be relatively large relative to the total current drain, if the current gains are low. The driving current can be, for instance, in the range of 50% and possibly even 75% of the total current and more. This is very troublesome, especially in integrated standard circuits which are to be used while being unchanged and without external intervention, for different load currents.

This is because while the dimensions must be laid out for the largest load currents, the same circuit is also to be used in applications with very low load currents, where the available supply currents are usually also very small.

Up to now, a Darlington output stage has usually been used in such cases, where the above-mentioned aspects with regard to the driving currents logically apply as well. Then, however, this current is one or two orders of magnitude smaller and can be neglected in comparison with those of the other stages.

It is found to be a disadvantage as compared to the single-ended output transistor, that the saturation voltage of about 0.9 V is higher by the amount of a base-emitter voltage. This however, is no longer adequate for instance, for reliably driving TTL-circuits, since this requires voltages smaller than 0.4 V.

With such a Darlington output stage, the problem of current drain is only solved at the price of less flexibility. (TTL circuits cannot be driven).

It is accordingly an object of the invention to provide a circuit for the load-proportional adjustment of the driving current of a single-ended output transistor of a transistor amplifier operated in a common-emitter circuit, which overcomes the hereinafore-mentioned disadvantages of the heretofore-known devices of this general type, and in which the above-mentioned residual-voltage problem does not arise.

With the foregoing and other objects in view there is provided, in accordance with the invention, a circuit for the load-proportional adjustment of the driving current of a single-ended output transistor of a transistor amplifier for a variable load of the output transistor, the output transistor having a base-emitter voltage and being operated in a common emitter circuit, having a control branch feeding the driving current to the output transistor, comprising a sensing transistor stage having an output circuit and being driven by the base-emitter voltage of the output transistor, a transistor serving as a driver transistor for the output transistor and being controlled by the control or input branch, and a coupling circuit through which current in the output circuit of said sensing transistor is feedable to said transistor serving as a driver transistor.

The above-defined construction according to the invention is based on the insight that the base-emitter voltage of the output transistor is a function of the output current and rises logarithmically with the latter. Information regarding the actually flowing output current is therefore available at the base emitter path of the output transistor without the need to intervene into the load circuit or to change the impedance situation in the load circuit by emitter resistors.

In accordance with another feature of the invention, the coupling circuit is a current reflector.

In accordance with a further feature of the invention, the sensing transistor stage is in the form of a transistor being operated in a common-emitter circuit and being connected in series with the current reflector.

In accordance with again another feature of the invention, there is provided a semiconductor crystal containing an integrated circuit, the output transistor and the sensing transistor being disposed immediately adjacent to each other in the crystal.

In accordance with a concomitant feature of the invention, there is provided a resistor connected to the emitter electrode of the sensing transistor.

Other features which are considered as characteristic for the invention are set forth in the appended claims.

Although the invention is illustrated and described herein as embodied in circuit for the load-proportional adjustment of the driving current of a single-ended output transistor of a transistor amplifier, operated in a common-emitter circuit, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the single FIGURE of the drawing, in which is a schematic circuit diagram of the invention.

DETAILED DESCRIPTION OF A PREFERRED EMBODIMENT

Referring now to the single FIGURE of the drawing, which is a circuit diagram, it is seen that a transistor T2 operated in a common-emitter circuit represents a single-ended output stage of a transistor amplifier. A load connected to a battery voltage $+U_B$ is connected into the collector circuit of this transistor $T_2$. For the sake of simplicity, the load is shown in the present embodiment example as a load resistance $R_L$. In practice, this load may be formed by the input resistance of another circuit, such as an integrated TTL circuit.

The base-emitter voltage of the output transistor $T_2$ is determined through a sensing transistor $T_3$. In integrated circuits, this determination or evaluation of the base-emitter voltage of the output transistor $T_2$ becomes particularly simple. If the sensing transistor $T_3$, according to a special feature of the invention, is disposed in the same semiconductor crystal in the immediate vicinity of the output transistor $T_2$, then it supplies the same current as the output transistor $T_2$, for the same base-emitter voltage, assuming the same geometry. With smaller dimensions of the sensing transistor $T_3$ relative to the output transistor $T_2$, the current is smaller by a defined factor.

The current flowing in the sensing transistor $T_3$ can now be fed back as the available driving current through a coupling circuit. This coupling circuit is now mirrored or reflected in the present embodiment example at the supply voltage $+U_B$ by a "current reflector" formed by transistors $T_4$ and $T_5$.

This current reflector has a defined current gain of, in particular, about 1.

Through the current reflector $T_4$, $T_5$, the collector of a driver transistor $T_1$ is fed. The transistor $T_1$ is supplied at its base from a control branch in the form of a current source 10 and, optionally, by a transistor $T_6$ controlled by non-illustrated earlier stages of the transistor amplifier.

In order to indicate that the control circuit can optionally comprise more complex circuits, the transistor $T_6$ is shown in dotted lines.

In a practical embodiment of the above-described and shown circuit, there may also be provided, according to a further embodiment of the invention, a small emitter resistor $R_e$, which is shown in dotted lines since it is not absolutely necessary. This resistor $R_e$ is provided as compensation for the path resistances of the output transistor $T_2$, which cause a somewhat exaggerated base-emitter voltage.

For a given, actually existing value, of the load resistance $R_L$, a given load current flows through the circuit of the output transistor $T_2$. A driving current flows for this actual load current in the circuit of the current source 10. The driving current is proportional to the quotient of the actually flowing load current and the product of the current gains of the transistors $T_1$ and $T_2$.

Only the saturation voltage of this transistor is obtained as the residual voltage at the collector-emitter path of the output transistor $T_2$. This has the further advantage over the above-explained Darlington configuration including the load transistor $T_2$ and a further transistor connected in series, that the residual voltage is smaller because in a Darlington configuration, the residual voltage is equal to the sum of the base-emitter voltage of the output transistor and the saturation voltage of the input transistor of the Darlington stage.

There is claimed:

1. Circuit for load-proportional adjustment of a driving current of a single-ended output transistor of a transistor amplifier for a variable load of the output transistor, the output transistor having a base-emitter voltage and being operated in a common emitter circuit, the driving current being fed via a control branch to the output transistor, comprising a sensing transistor stage having an output circuit and being driven by the base-emitter voltage of the output transistor, a transistor serving as a driver transistor for the output transistor and a coupling circuit through which current in the output circuit of said sensing transistor is feedable to said transistor serving as a driver transistor.

2. Circuit according to claim 1, wherein said coupling circuit is a current reflector.

3. Circuit according to claim 2, wherein said sensing transistor stage is in the form of a transistor being operated in a common-emitter circuit and being connected in series with said current reflector.

4. Circuit according to claim 1, formed as an integrated circuit in a semiconductor crystal, the output transistor and said sensing transistor being disposed immediately adjacent to each other in said crystal.

5. Circuit according to claim 1 or 3, including a resistor connected to the emitter electrode of said sensing transistor.

* * * * *